(12) United States Patent
Su et al.

(10) Patent No.: US 10,109,404 B2
(45) Date of Patent: Oct. 23, 2018

(54) LOW PROFILE COUPLED INDUCTOR SUBSTRATE WITH TRANSIENT SPEED IMPROVEMENT

(71) Applicant: Virginia Tech Intellectual Properties, Inc., Blacksburg, VA (US)

(72) Inventors: Yipeng Su, Blacksburg, VA (US); Dongbin Hou, Blacksburg, VA (US); Fred C. Lee, Blacksburg, VA (US); Qiang Li, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 92 days.

(21) Appl. No.: 14/956,948

(22) Filed: Dec. 2, 2015

(65) Prior Publication Data

US 2016/0086723 A1 Mar. 24, 2016

Related U.S. Application Data

(63) Continuation-in-part of application No. 14/177,531, filed on Feb. 11, 2014, now Pat. No. 9,564,264.

(Continued)

(51) Int. Cl.
| | | |
|---|---|---|
| H01F 5/00 | (2006.01) | |
| H01F 27/28 | (2006.01) | |
| H01F 1/14 | (2006.01) | |
| H01F 17/00 | (2006.01) | |
| H05K 1/03 | (2006.01) | |
| H01F 3/14 | (2006.01) | |
| H02M 3/155 | (2006.01) | |
| H05K 1/02 | (2006.01) | |
| H05K 1/16 | (2006.01) | |

(52) U.S. Cl.
CPC ............... *H01F 1/14* (2013.01); *H01F 3/14* (2013.01); *H01F 17/0033* (2013.01); *H05K 1/0373* (2013.01); *H01F 2017/002* (2013.01); *H02M 3/155* (2013.01); *H05K 1/0233* (2013.01); *H05K 1/165* (2013.01); *H05K 2201/0209* (2013.01); *H05K 2201/0245* (2013.01); *H05K 2201/086* (2013.01); *H05K 2201/10015* (2013.01)

(58) Field of Classification Search
CPC ......... H01F 5/00; H01F 27/28; H01F 27/2804
USPC .................................................. 336/200, 232
See application file for complete search history.

(56) References Cited

U.S. PATENT DOCUMENTS

| 6,281,778 B1 * | 8/2001 | El-Sharawy | ........ H01F 17/0006 |
| | | | 257/531 |
| 2004/0208032 A1 * | 10/2004 | Edo | ..................... H01F 17/0033 |
| | | | 363/147 |

(Continued)

FOREIGN PATENT DOCUMENTS

JP 06053045 A * 2/1994

*Primary Examiner* — Tsz Chan
(74) *Attorney, Agent, or Firm* — W&C IP

(57) ABSTRACT

A low profile inductor structure suitable for use in a high power density power converter has one or more windings formed by vias through a thin, generally planar body of magnetic material forming the inductor core and conductive cladding on the body of magnetic material or material covering the magnetic material body. Variation of inductance with load current and other operational or environmental parameters is reduced to any desired degree by forming a slot that removes all or a portion of the magnetic material between the locations of the vias.

13 Claims, 17 Drawing Sheets

Related U.S. Application Data

(60) Provisional application No. 62/107,026, filed on Jan. 23, 2015, provisional application No. 61/872,212, filed on Aug. 30, 2013.

(56) References Cited

U.S. PATENT DOCUMENTS

| | | | |
|---|---|---|---|
| 2006/0049905 A1* | 3/2006 | Maeda | H01F 17/0013 336/200 |
| 2006/0081397 A1* | 4/2006 | Enchi | H05K 1/165 174/260 |
| 2007/0075819 A1* | 4/2007 | Okuzawa | H01F 17/0033 336/200 |
| 2008/0143468 A1* | 6/2008 | Yokoyama | H01F 1/342 336/200 |
| 2011/0291789 A1* | 12/2011 | Dalmia | H01F 17/0006 336/200 |
| 2013/0043968 A1* | 2/2013 | Cho | H01L 23/5223 336/200 |
| 2014/0104288 A1* | 4/2014 | Shenoy | G09G 5/00 345/531 |
| 2014/0176281 A1* | 6/2014 | Jung | H01F 27/2804 336/200 |

* cited by examiner

Top view          Bottom view

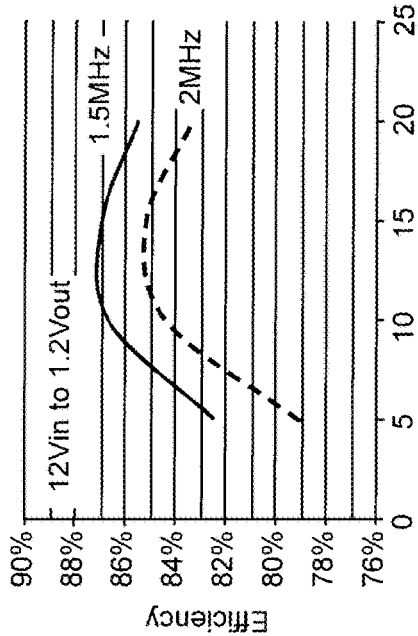
Figure 9
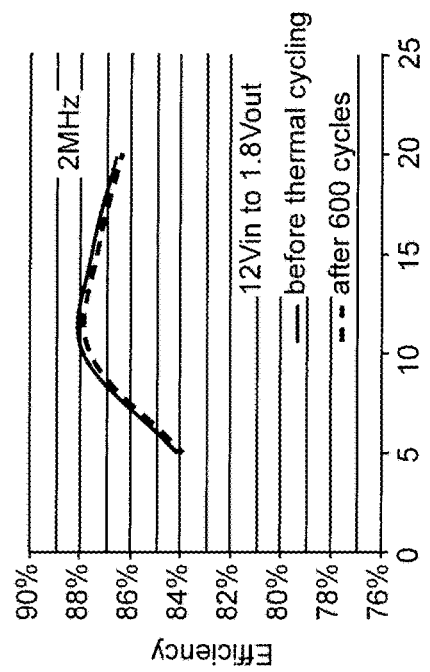
Figure 10
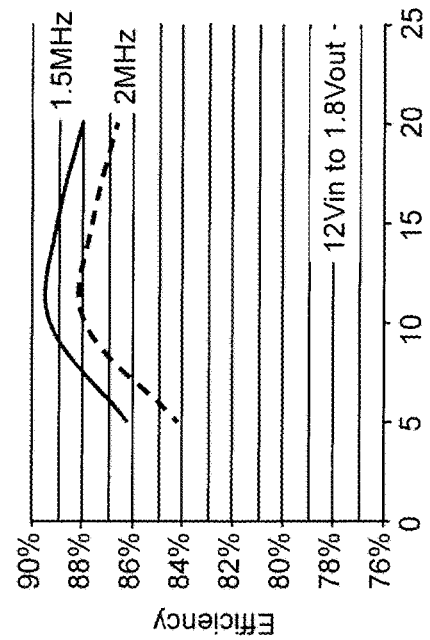
Figure 11
Figure 12 time/mSecs                1uSecs/div

LOW PROFILE COUPLED INDUCTOR SUBSTRATE WITH TRANSIENT SPEED IMPROVEMENT

CROSS-REFERENCE TO RELATED APPLICATIONS

This application claims benefit of priority of U.S. Provisional Application 62/107,026, filed Jan. 23, 2015, and is a continuation-in-part of U.S. patent application Ser. No. 14/177,531, filed Feb. 11, 2014, which claims benefit of priority of U.S. Provisional Application 61/872,212, filed Aug. 30, 2013, all of which are hereby incorporated by reference in their entireties.

FIELD OF THE INVENTION

The present invention generally relates to point-of-load (POL) power converters and, more particularly, POL power converters having very high power density as is particularly desirable for portable electronic devices and, more particularly, to low profile POL power and POL power converters having improved transient response.

BACKGROUND OF THE INVENTION

Virtually all electronic devices operate on power which must be of substantially constant or regulated voltage and thus require a power supply capable of delivering power at such voltage, often at relatively high current. However, in many such devices, current can fluctuate very rapidly. The voltages required can also differ widely between such devices and within a given device. For example, modern microprocessor chips, when operating at full clock speeds may require hundreds of amperes at a fraction of a volt on a given chip and yet require voltages of several volts to communicate between chips while presenting a very light load and draw low current levels when in an idle or stand-by state while being able to shift between idle of stand-by states and full operation very quickly and often. Similarly, memory chips generally require little power during normal operation but may require substantial power for periodic refresh which must be performed rapidly and often.

The increasing popularity of portable devices such as laptop computers, smart phones, personal digital assistants and panel type computers, particularly of the hand-held type, has put increasing demands on the design and manufacture of power supplies, generally referred to as power converters, voltage regulators or the like. For such devices, small size, light weight and a high level of functionality are extremely desirable. Therefore, it is considered imperative to develop and use power converters for such devices that are as small and light weight as possible since the power converter(s) do not directly contribute to the ultimate functionality of the device. Conversely, the need for limitation of size and increase of power density of power converters is, if anything, greater than the need for size limitation and increased functionality in such devices since any volume reduction in the required power converter(s) can be used for providing increased functionality of the portable device.

Additionally, the requirement for close voltage regulation at very low voltages and very high currents has led to the concept of point-of-load power converters so that the power connections may be kept very short to limit voltage drop in the power connections and the impact of parasitics and to limit the propagation time of signals from the load to control operation of the power converter. Since the semiconductor chips and other loads may be very small, there is increased pressure to produce power converters of comparable sizes in order to place them as closely as possible to the device being powered.

Additionally, among the many power converter topologies that are known, resonant converters and/or so-called buck/boost converters, in particular, have drawn substantial interest for portable devices. While these topologies are not of minimal complexity, they are still favored for efficiency and the ability to extract more power from rechargeable battery power sources since they can regulate their outputs at voltages above the voltage of the input power source which diminishes as battery charge is drawn down.

While much effort has been expended in recent years to provide power converters of reduced size and increased power density, none has satisfied all power converter requirements for hand-held devices of current and foreseeable designs prior to the low profile power converter disclosed in the above-incorporated U.S. patent application Ser. No. 14/177,531, which provided a lateral flux inductance incorporated in a substrate. However, it has been found that transient performance of that inductor was limited due to the non-linearity of the inductance with load/current.

SUMMARY OF THE INVENTION

It is therefore an object of the present invention to provide a low profile lateral flux inductor structure, preferably having an inductance of reduced non-linearity or substantially linear inductance with load/current.

In order to accomplish these and other objects of the invention, a coupled inductor is provided having two inversely coupled windings formed by vias in a layer of magnetic material and cladding on lamina of magnetic material or material surrounding such lamina of magnetic material, said lamina of magnetic material including a slot extending in a direction between two vias of respective ones of the two inversely coupled windings.

In accordance with another aspect of the invention, an inductor comprising a generally planar core of magnetic material having opposing major exterior surfaces of transverse dimensions which are large compared to a thickness of said core, and a winding comprised of at least four vias through said thickness of said core and cladding on a major exterior surface of said core to form a winding of at least two turns wherein electrical connections of two of the at least four vias form connections to said winding and wherein magnetic flux in said core is substantially parallel to said exterior major surfaces and has no directional component in a direction of said thickness of said core.

In accordance with a further aspect of the invention, a method of reducing variation of inductance with load of a low-profile coupled inductor comprising steps of forming two coupled windings comprising separated vias through a lamina of magnetic material and forming a slot in the lamina between locations of the vias.

BRIEF DESCRIPTION OF THE DRAWINGS

The foregoing and other objects, aspects and advantages will be better understood from the following detailed description of a preferred embodiment of the invention with reference to the drawings, in which:

FIG. 9 is a photographic size comparison of a power converter module in accordance with the invention with a familiar coin, FIGS. 10 and 11 are graphic comparisons of efficiencies of power converters in accordance with the invention when operated at different frequencies at respective output voltages, FIG. 12 is a graphic comparison of the efficiency of a power converter in accordance with the invention before and after an industry standard thermal cycling test.

DETAILED DESCRIPTION OF A PREFERRED EMBODIMENT OF THE INVENTION

Figure 1A:
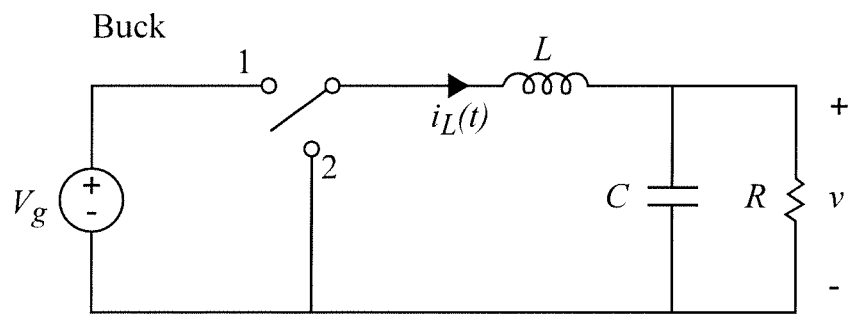
FIGS. 1A, 1B and 1C are schematic diagrams of exemplary power converter topologies.
Figure 1B:
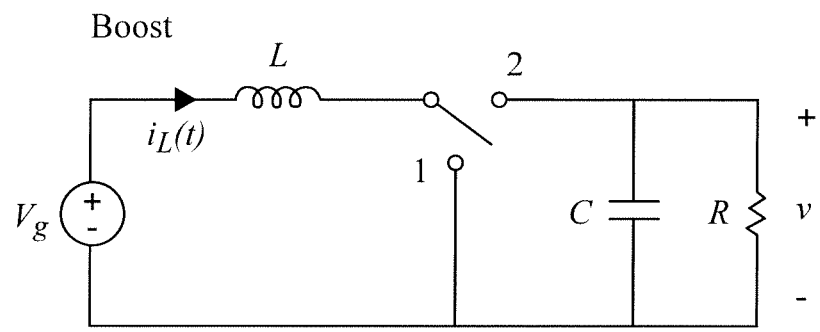
Figure 1C:
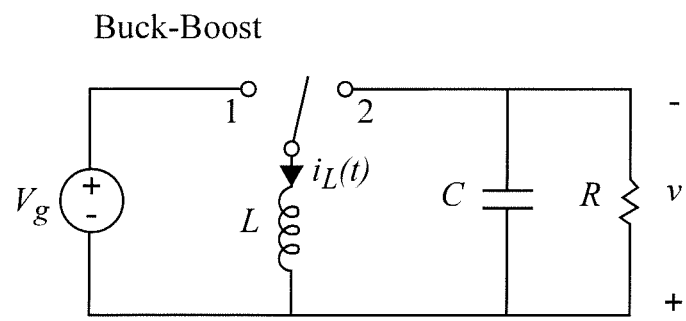

Referring now to the drawings, and more particularly to FIGS. 1A-1C, there are shown schematic diagrams of three exemplary basic types of power converter topologies that can be implemented in accordance with the invention. While the modes of operation of these topologies are well-known, many variants of the actual circuits have been developed to which the invention is also applicable. The invention is also applicable to any other power converter topology as long as the magnetic components are included, whether currently known or foreseeable.

It should be understood that the schematic diagrams of FIGS. 1A-1C are simplified to the minimum required components for each topology and are arranged to facilitate conveyance of an understanding of the invention and the problems for which the invention provides a solution. Therefore, no portion of any of FIGS. 1A-1C is admitted to be prior art as to the present invention. Therefore these Figures have been labeled as "Related Art".

The buck converter illustrated in FIG. 1A is utilized where an output voltage lower than the power supply voltage is required by the load (depicted as a resistor, R, in each of FIGS. 1A-1C). This function is achieved by locating the inductor relative to the switch (which is usually embodied by two or four transistors which are controlled to be alternately conductive) such that increasing and decreasing currents through the inductor as the power supply is connected and disconnected develop voltages that oppose the power supply voltage when connected and cause so-called freewheel current when the power supply is disconnected. At the present time, this topology is possibly the most popular for inclusion in portable electronic devices.

The boost power converter topology illustrated in FIG. 1B is most applicable to devices that require power to be supplied at an output voltage that is greater than the power supply to the power converter. This function is achieved by repeatedly drawing a substantial current by being directly connected across the power supply to store energy in the inductor and then connecting the inductor to the output filter (represented by capacitor, C, in FIGS. 1A-1C) and the load. Since the current in the capacitor will decrease quickly when it is disconnected from the power source, the inductor develops a voltage which can be much higher than the input voltage source. That is, the inductor is charged by the source voltage and discharges by the voltage difference between the load and the source. The load voltage should be higher than the source voltage in order to achieve a voltage-second balance on the inductor in each switching cycle. Since the inductor remains connected to the input power source when the inductor is connected to the filter the voltage applied to the filter will be the sum of the power source voltage and the inductor voltage. This power converter topology is substantially less popular for inclusion in portable electronic devices than the buck converter of FIG. 1A but is indispensable for some applications.

The buck-boost power converter topology illustrated in FIG. 1C can deliver power at an output voltage that can be either lower or higher than the input power source voltage. This function is achieved, in the circuit shown, by storing energy in the inductor in much the same manner as in the boost topology described above. The inductor is charged by the source voltage and discharged by the load voltage alternately in each switching cycle. To achieve a voltage-second balance, when the load voltage is below the source voltage, the duty cycle will be less than 0.5; otherwise, when the load voltage is greater than the source voltage, the duty cycle is greater than 0.5. The load voltage has an opposite polarity with respect to the source voltage. There is rapidly growing interest in this topology since it can extract more power from a power storage device such as a rechargeable battery that exhibits a decrease in voltage as power is drawn therefrom. Therefore, this topology can provide power for longer periods of operation for a single battery charge. Such a function can also be exploited to permit a reduction in the size, weight and cost of a rechargeable battery for a portable or hand-held device.

It should be appreciated from the above discussion that, while the different power converter topologies operate very differently and have different functions and characteristics, they are all constituted by exactly the same basic components which are interconnected in different ways: a switch, usually comprised of either a two transistor half-bridge circuit or a four transistor full bridge circuit, an inductor, an output filter capacitor (sometimes referred to as an input capacitor in point-of-load power converters since it is electrically and physically located at the input to the load), all of which require significant volume, input and output terminals and connections between the switch, inductor and capacitor. The connections and input and output connections generally represent negligible volume but require at least some area on a substrate which must also be provided to support these components and their interconnections and thus allow the components to be integrated into a small, low profile power converter module.

To reduce power converter size and volume and increase power density and volume and to provide a generally planar shape of minimal thickness as dictated by the desirable low profile shape of portable and hand-held devices, reduction of the volume of these components must be considered. However, capacitors of minimal size are commercially available and no significant reduction in volume is possible with capacitors of currently known and mature technologies. Similarly, transistors suitable for power converter switches are known and commercially available either as discrete components or integrated half bridge or full bridge circuit packages which will be of a size that is designed to be minimal for anticipated heat dissipation requirements or ratings. Therefore, the remaining candidates for volume and dimensional reduction and integration with improved efficiency of space utilization while maintaining or enhancing operational efficiency without requiring technologies that are not mature are the inductor, the magnetic material of the inductor and the substrate.

Since most power converters of current design use printed circuit boards (PCBs) to support the components, the technology of printed circuit board (including so-called multi-layer and double-sided PCB) manufacture and electronic device manufacture on PCBs are both highly mature technologies. Since multi-layer PCBs are laminated structures, they can include embedded components such as wiring. It has been found by the inventors that a magnetic core can also be embedded in a PCB structure without requiring any process which is incompatible with known production processes for conventional PCBs. Moreover, when the magnetic core material is embedded by sandwiching it between lamina of the PCB, the windings for the inductor can be formed of the metal (e.g. copper) cladding layers on both outer sides of the PCB or between PCB lamina together with vias through the magnetic core material (also a very mature technology) to form an inductor of very low profile. This type of structure also essentially removes the volume and footprint of the inductor from the total substrate area and the total volume of the integrated power converter module in accordance with the invention as well as avoiding wasted space between the inductor and other components supported by the substrate.

Figure 2A:
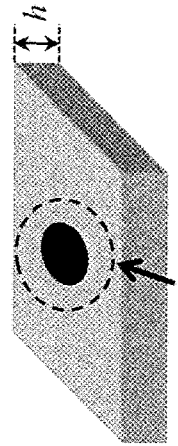
FIGS. 2A and 2B are schematic illustrations of two types of planar inductor cell structures.
Figure 2B:
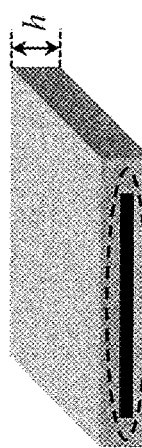

Due to the high aspect ratio corresponding to a desirable low profile of the inductor, the design of the inductor that functions as well as a discrete inductor component is somewhat difficult. In terms of the flux path pattern, possible inductor designs employing magnetic material embedded in a PCB are constrained to being one of two types: a so-called vertical flux type in which magnetic flux in the core has some regions where the flux is perpendicular to the plane of the PCB, and a lateral flux type in which the magnetic flux is entirely in a direction parallel to the plane of the PCB. Basic cells of these two types of inductor designs are illustrated in FIGS. 2A and 2B in which the magnetic material is indicated by relatively lighter shading while a portion of the windings is indicated by relatively darker shading.

As is known, for a given cross-sectional area of a winding, a cylindrical winding yields the shortest magnetic path length. However, if the core thickness or height, h, is limited to a sufficiently small value, a cylindrical winding cannot be used and in order to maintain the same cross-sectional area of the winding to maintain the same winding resistance, an elongated rectangular winding with a higher aspect ratio must be used instead; resulting in increased magnetic reluctance, a decrease in energy density, increased magnetic path length and decoupling of the flux distribution from the core thickness.

Figure 3:
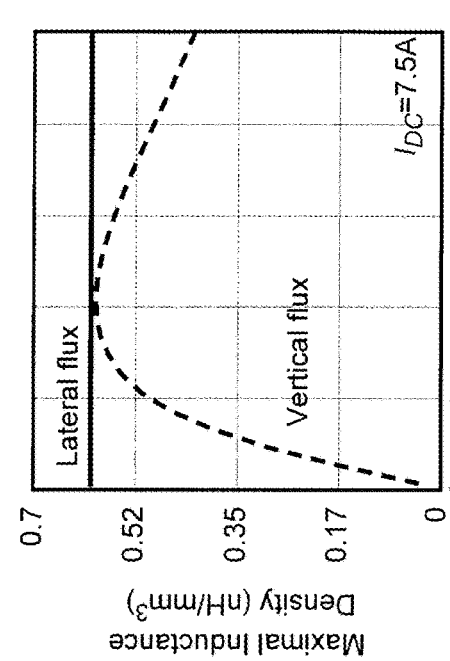
FIGS. 3 and 4 are graphical comparisons of inductance density of the two types of planar inductor cell structures of FIGS. 2A and 2B for different currents and winding cross-sectional areas.
Figure 4:
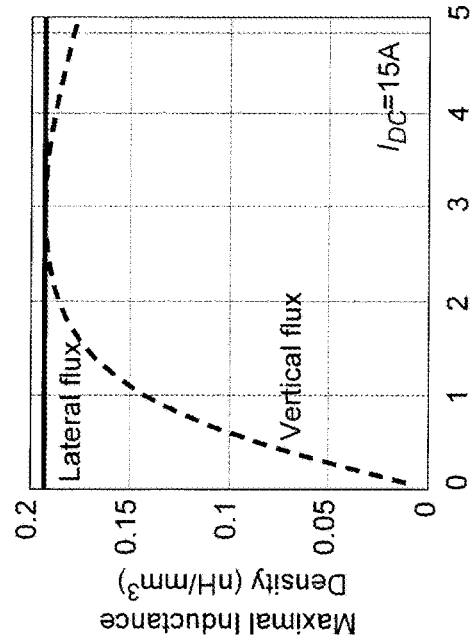

FIGS. 3 and 4 show the maximal coupling inductance that can be achieved as a function of dimension h for inductors of the vertical flux type and lateral flux type and the same winding cross section. In FIG. 3, the inductor current is 15 A and the winding cross-sectional area is 1.5 $mm^2$. In FIG. 4, the inductor current is 7.5 A and the winding cross-sectional area is 0.75 $mm^2$. It can be seen that, for vertical flux type low profile inductors, the maximal inductance is severely affected by inductor thickness or height, h, although an inductance equal to a lateral flux inductor can be achieved. On the other hand, the inductance of a lateral flux type inductor is completely insensitive to h. It should also be appreciated from FIGS. 3 and 4 that if a change in the inductor current is accompanied by a corresponding (e.g. proportional) change in winding cross-sectional area, the optimal core thickness for vertical flux type inductors will also change accordingly. Therefore, a vertical flux inductor structure does not allow flexibility of application to devices having different or variable current requirements for a given inductor design. Thus, for power converters for general applications, a lateral flux structure would clearly be preferable particularly for devices presenting larger loads.

Figure 5A:
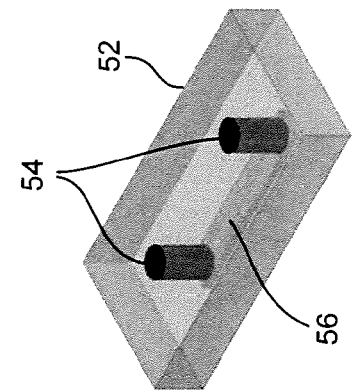
FIGS. 5A, 5B and 5C illustrate construction of windings of different numbers of turns for lateral flux planar inductors.
Figure 5B:
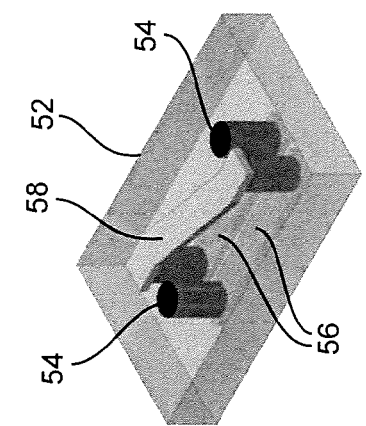
Figure 5C:
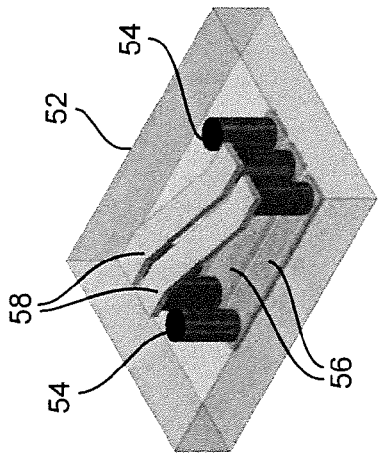

Referring now to FIGS. 5A-5C, structures of lateral flux type inductors having different numbers of turns are illustrated in isometric and semi-transparent views. Each of these inductor structures is comprised of a body of magnetic material 52, each comprising a pair of adjacent basic cells as illustrated in FIG. 2B, vias 54 and bottom connections 56 extending between vias preferably formed by metallization on an insulator covering the magnetic material and, if more than one turn is to be formed, angled connections 58 between the vias on top of the magnetic material. External connections to the terminals of the windings are omitted for clarity in these Figures but are preferably formed of the same metallization as the angled connections 58. Of course, connections could be made directly to the exposed vias 54. This type of structure can be extended to form as many turns as may be desired to increase inductance density but at a cost of increased electrical resistance for a given conductivity of vias and metallization thickness. The connections 56, 58 should be placed as closely together as possible to maximize mutual coupling between turns of the winding. Estimation of inductance and core loss can be made by simulation.

Figure 6:
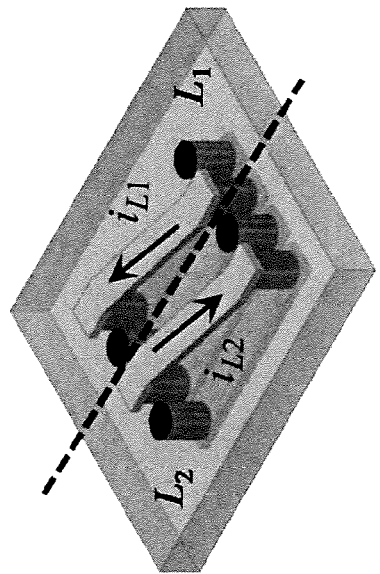
FIG. 6 illustrates an inductor structure having inversely coupled windings.

The performance of the inductor structures of FIGS. 5A-5C can be improved by providing two inversely coupled inductors embedded in the same body of magnetic material as illustrated in FIG. 6. If connections to the respective windings such that the current in the respective windings flows in opposite directions, the flux created in the core by each winding will also be in opposite directions and will largely cancel. Compared with the structures shown in FIGS. 5A-5C, the inverse coupling provides two significant benefits. First, the equivalent transient inductance, which impacts the transient speed of the converter, becomes smaller than the equivalent steady-state inductance, which determines the steady-state ripple of the converter. Therefore, high transient response and high efficiency can be simultaneously obtained. Second, because of the DC flux cancellation, the magnetic core can operate at a lower DC bias condition than an inductor that does not include inverse coupling. Because the permeability of high frequency magnetic materials is usually dependent on the DC bias condition, the incremental permeability at low DC bias is larger than that at a high DC bias condition and the core volume can be reduced because of the larger incremental permeability. Because the maximal inductance density for lateral flux inductors is substantially invariant with core thickness, h, as discussed above, core thickness for inductors having inductor currents of interest (e.g. above about 10 A) without inverse coupling can be reduced below 1 mm without inverse coupling and even further reduced through use of inverse coupling.

In regard to the selection of magnetic materials, several different magnetic materials have been used in various known approaches to low profile inductors embedded in PCBs. Such materials include a ferrite polymer compound (FPC) material, a Permalloy foil and sintered MnZn ferrite, each of which has its own limitations in regard to application to a low profile inductor for relatively high inductor current and high frequency operation. Specifically, the FPC material is preferable in terms of cost and compatibility with PCB manufacturing processes but exhibits higher losses and lower permeability for high frequency operation. Permalloy materials such as NiFe and CoNiFe have very high permeability and saturation flux density but the thickness of the magnetic alloy has to be reduced below 20 μm and laminated with interleaved layers of insulating materials to hold eddy current losses to an acceptable level due to the low resistivity of such materials. The laminating process is complicated and the result is unsuitable for medium to high current applications where a large core volume is needed and cannot, as a practical matter, be achieved in a core that is as thin as is possible using other materials due to the volume occupied by the insulation. MnZn ferrite has high permeability, low core loss density and adequate core thickness at thicknesses suitable for embedding in a PCB but the rigidity and hardness of the ferrite requires special facilities for shaping and patterning the material and thus is not competitive for mass production.

The inventors have found that another material is commercially available and avoids the above problems of unsuitability for low profile power converters. Specifically, magnetic alloys such as the Permalloy materials discussed above can be milled into flakes with a high aspect ratio (e.g. 1 μm thickness and 100 μm lateral dimension). After being coated with $SiO_2$ oxide and being hot pressed with an organic binder such as epoxy, thicknesses from well below 1 mm to several millimeters of the flake composite can be obtained. The flake composite exhibits the same high permeability and high saturation flux density of the original material while the volume of insulator and binder is low in the composite material. The composite material is also soft and can be shaped and cut with ordinary cutting and shaping machines that are common in mass production environments. The only criticality is that the flakes must be aligned in parallel with respect to an external magnetic field to minimize eddy current loss. A suitable material having suitably dimensioned flakes that are suitably aligned is available from NEC-Tokin. While this flaked material is greatly preferred for practice of the invention, commercially available LTCC materials and the like can also be used, particularly if inversely coupled windings are used, as discussed above, to reduce the stringency of requirements for high permeability.

Figure 7A:
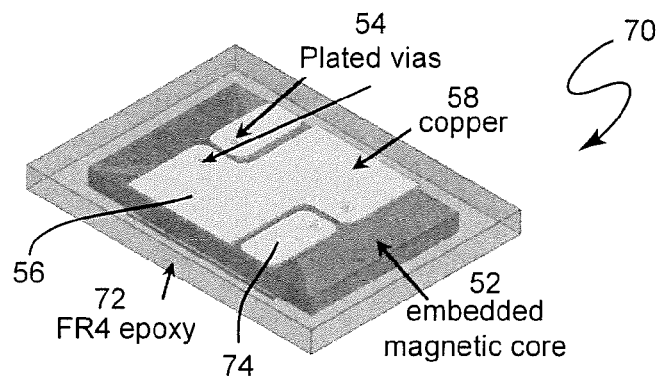
FIG. 7A is an isometric view of a planar inductor structure in accordance with the invention.
Figure 7B:
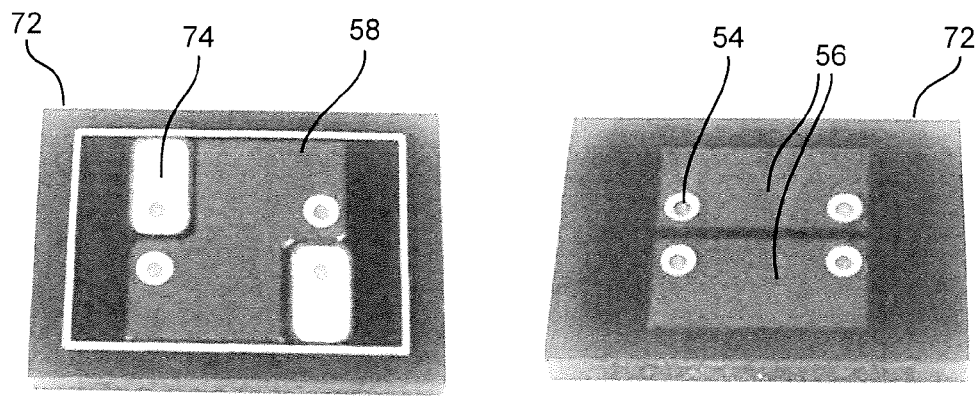
FIG. 7B illustrates top and bottom views of the planar inductor structure of FIG. 7A.

Assuming use of a lateral flux pattern for the reasons discussed above, the structure of an exemplary PCB-embedded two-turn inductor 70 is illustrated in FIGS. 7A and 7B. FIG. 7A is an isometric, semi-transparent view of the inductor design and FIG. 7B shows top and bottom views of a corresponding prototype inductor. It should be understood that while an exemplary two-turn winding is shown, any number of windings could be provided to obtain the required inductance density and inverse coupling could be provided, if desired, to accommodate the permeability of the magnetic material and/or allow reduction of the thickness of the magnetic material 52 embedded in a two-layer PCB laminated structure 72 of, for example, epoxy, with copper layers on the top and bottom from which connections 58 and 56 and terminals 74 are formed, preferably by etching subsequent to formation of vias 54. Vias 54 are formed by drilling, preferably subsequent to the embedding of the magnetic material in the PCB, and plating of the interior of the holes, which also serves to make connections to the copper layers forming connections 74, 56 and 58. This structure can thus form a substrate for supporting other components of the power converter and yet requires no additional volume and no surface area to be provided for the inductor, itself, but only connections thereto. However, as will be discussed below in connection with FIG. 8, a further shielding layer and a further PCB lamina and cladding is preferably added to this structure for forming the low profile, high current power converter in accordance with the invention.

To complete the embedded inductor POL power converter, silicon power devices are preferably used at the present time rather than GaN devices alluded to above since the technology of the former is currently much more mature and of low cost and thus appropriate for industrial production. To achieve high frequency operation commercially available driver MOS, sometimes referred to as DrMOS, integrated circuit switches in which the switching transistors are differently optimized to reduce losses for high currents and low voltages, are preferred and have high and low side switches as well as drivers integrated on a single chip and are commonly used in commercial products at the present time. By reducing the parasitic inductance and resistance between each component in these devices, the switching loss can be minimized and the devices can potentially operate at frequencies up to 2 MHz. Such commercially available devices have current ratings of up to 25 A.

Figure 8:
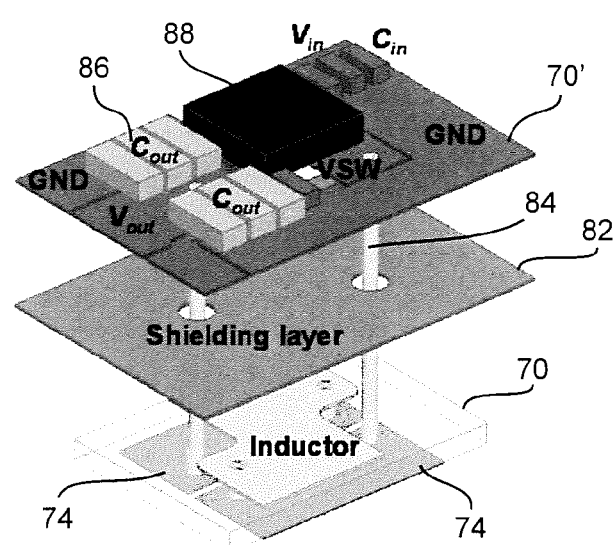
FIG. 8 is an exploded view of a power converter module structure in accordance with the invention.

An exploded view of the preferred layout of the low profile, multi-layer embedded inductor power converter in accordance with the invention is illustrated in FIG. 8. The PCB embedded inductor 70, as discussed above, preferably forms the lower two or more layers. As alluded to above, shielding layer 82 forming a third layer and a further one or more PCB lamina 70' with cladding forming one or more fourth or upper layers are additionally laminated thereto. Connections are made from the cladding to the PCB embedded inductor through plated vias 84 (exaggerated in length in this exploded view) terminating on cladding terminals 74.

The filter capacitor, C, of FIGS. 1A-1C is preferably formed by a plurality of parallel connected capacitors 86 to maintain a low profile and should be located as closely as possible to the DrMOS integrated circuit switches 88 to reduce parasitic capacitance. Conductive shield layer 82 is a complete shield layer and should be as close as possible to the cladding of the top layer by making the additional PCB lamina 70' as thin as possible. The eddy currents induced in the shield layer 82 by high frequency AC current in the switches creates an opposite flux to cancel the flux created by the parasitic loop inductance of the (buck) converter loop. Therefore, the loop inductance and the switching loss can be reduced. Input and output terminals $V_{in}$, $V_{out}$ and GND are preferably formed by etching of the cladding of layer 70'. If the power converter is used as a POL power supply, it is generally desirable to include an input capacitor $C_{in}$ which can be located as illustrated as closely as possible to the DrMOS integrated circuit switches to reduce parasitic capacitance.

The completed multi-layer PCB embedded inductor low profile power converter is illustrated adjacent to a United States Quarter Dollar coin for a comparison of size in FIG. 9. The thicknesses of modules designed for operation at 1.5 MHZ and 2.0 MHZ are only 3.7 mm and 3.5 mm, respectively. The area or footprint of the entire power converter is much less than one square inch. FIG. 10 shows that the efficiency of the power converter in accordance with the invention and operating with a 12V input and 1.2V output is in the range of 80%-88% depending on switching frequency and output current. When the output voltage is increased to 1.8V the efficiency is increased to about 90% as shown in FIG. 11. With an output voltage of 1.2V the low profile POL power converter in accordance with the invention can achieve a power density of 700 W/in$^3$ operating at a switching frequency of 1.5 MHZ and a power density of 800 W/in$^3$ operating at a switching frequency of 2.0 MHZ. This power density achieved by the invention is approximately five to eight times the power density of state of the art alternative for producing comparable current levels and is achieved with well-known and mature manufacturing technology and commercially available magnetic material, capacitors and switch components.

The low profile power converter in accordance with the invention has also been subjected to an industry standard thermal cycling test in order to evaluate the reliability and robustness of the power converter in accordance with the invention. In accordance with the JEDEC standard (JESD22-A104D test condition M) the temperature of the power converter was varied from −40° C. to 150° C. in one-hour cycles. After 600 cycles there was negligible change in efficiency of the low profile power converter in accordance with the invention, as illustrated in FIG. 12; thus validating the reliability of the embedded magnetic core inductor structure and the multi-layer circuit embodiment.

In view of the foregoing, it is clearly seen that the PCB embedded magnetic material inductor, particular magnetic materials and a multi-layer architecture (preferably considered as a four layer architecture) and layout can each provide significant increases in power density of power converters capable of delivering currents in the range of 10 A-40 A. However, as discussed above, these factors and design issues can be combined and optimized relative to each other to provide a very significant increase in power density in a low profile package applicable to a wide range of current and foreseeable electronic devices and which is capable of being mass produced using only mature technologies which are known to be reliable and available in manufacturing environments. The power converter in accordance with the invention can be applied to any known or foreseeable power converter topology and does not significantly compromise the efficiency of any power converter topology to which the PCB embedded inductor, flaked magnetic material and or -layer architecture may be applied singly or in any combination.

Figure 13:
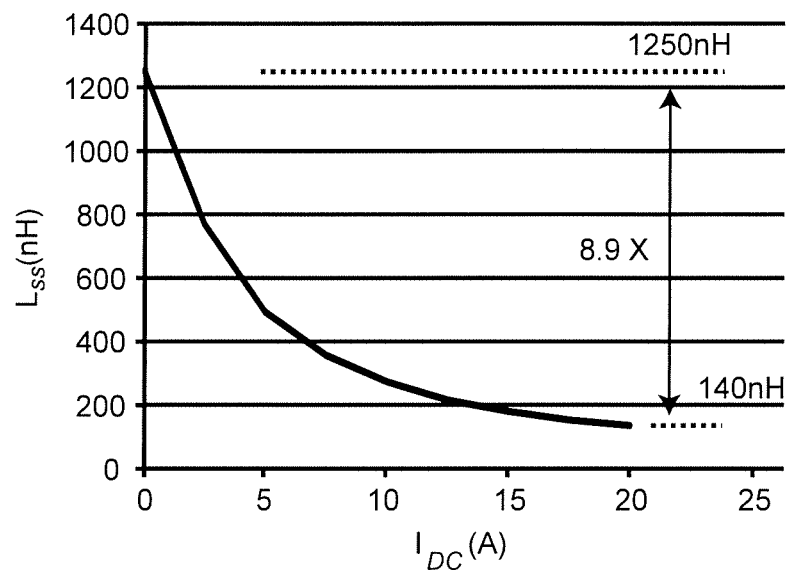
FIGS. 13 and 14 are graphs of inductance as a function of DC load current of the coupled inductor structure of FIG. 6.
Figure 14:
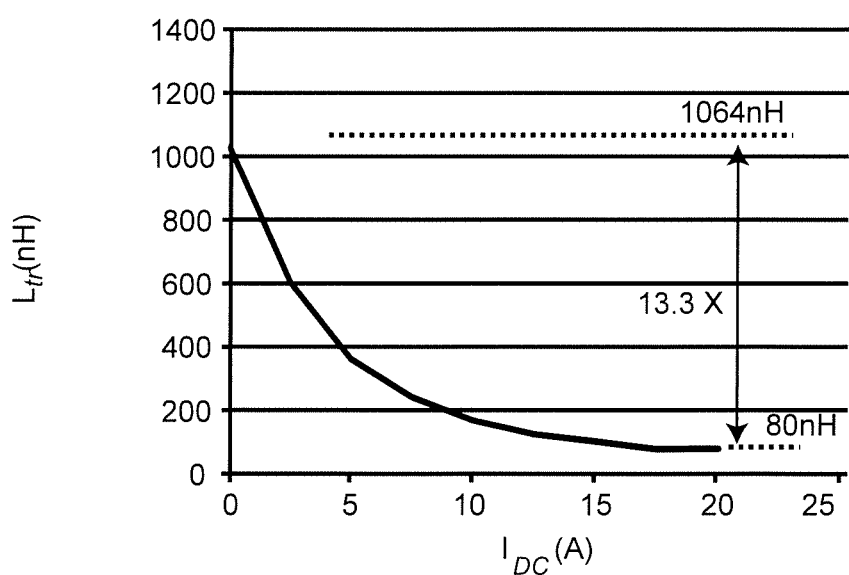
Figure 15:
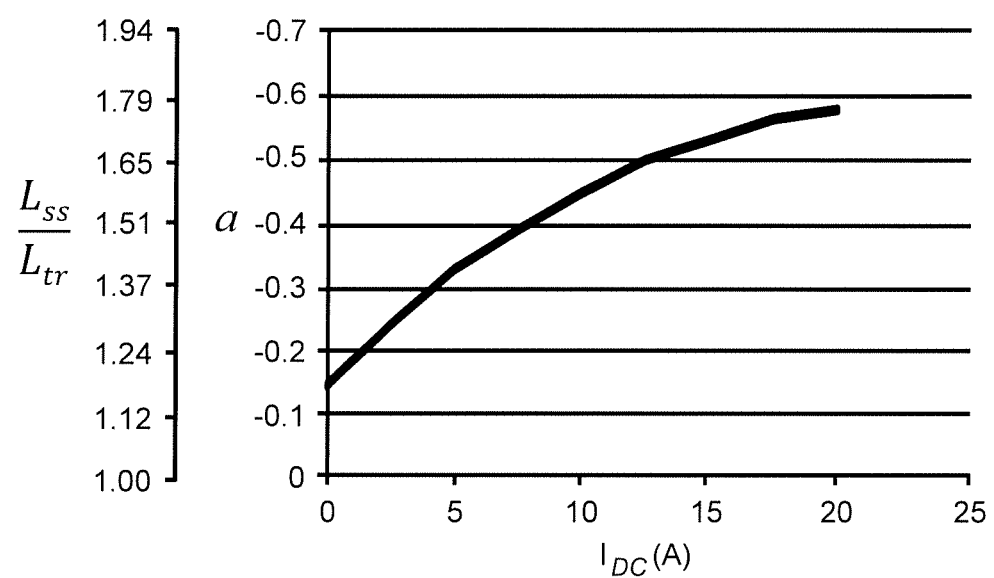
FIG. 15 is a graph of coupling coefficient as a function of load current in the coupled inductor of FIG. 6, FIGS. 16A, 16B and 16C show step-up and step-down voltage waveforms of the power converter of FIG. 8.

However, the inventors have found that the inductance of an inductor of the type described above, when applied to a power converter, exhibits a widely variable inductance over a range of load current. As noted above, the structure and electrical/magnetic behaviors of the inverse coupled inductor described above is controlled by three different dimensional parameters; the size of the core, g, used to control the footprint of the coupled inductor, the thickness of the core, h, which is directly proportional to the inductance value required by the converter and the distance between the two windings, d, which can be used to control the coupling coefficient, as labeled in FIG. 26. For one design with g=3.0 mm, d=2.5 mm and H=1.8 mm, the equivalent steady state inductance, $L_{ss}$, transient inductance, $L_{tr}$, and coupling coefficient, α, are plotted as a function of DC load current in FIGS. 13-15, respectively. It can be readily appreciated from these graphs that the variation in inductance is also very non-linear and that the inductance is increased significantly when the DC load current is reduced. Specifically, the inductance value of 143 nH at a steady state current of 20 A increases to 1250 nH at no load (0 A), a factor of about nine. This non-linear increase with steady state current decrease is advantageous since it reduces output current ripple under light load conditions. However, the inductance change under transient changes in load current is more prominent and does not provide any advantage in power converter applications. Specifically, FIG. 4 indicates that transient inductance is increased from 82 nH at heavy load to 1064 nH at no load, a factor of more than thirteen. In general, larger inductances tend to reduce transient speed because the rate of change of the inductor current is inversely proportional to the inductance with a given voltage-second product applied across the inductor. The greater increase of transient inductance relative to the change in steady state inductance can be understood from the change in coupling coefficient with change in DC current since the coupling becomes weaker with increasing DC current. In the above example, as plotted in the graph of FIG. 15, the coupling coefficient becomes weaker from −0.58 at heavy load to only −0.15 at no load. The ratio of steady state inductance to transient inductance is related to the coupling coefficient. Thus the ratio of steady state inductance and transient inductance becomes larger when the coupling is stronger (e.g. the transient and steady state inductance values diverge). Conversely, when the coupling is weaker at light load, the transient and steady state inductance values are brought closer to the same value but still differ significantly.

Figure 16A:
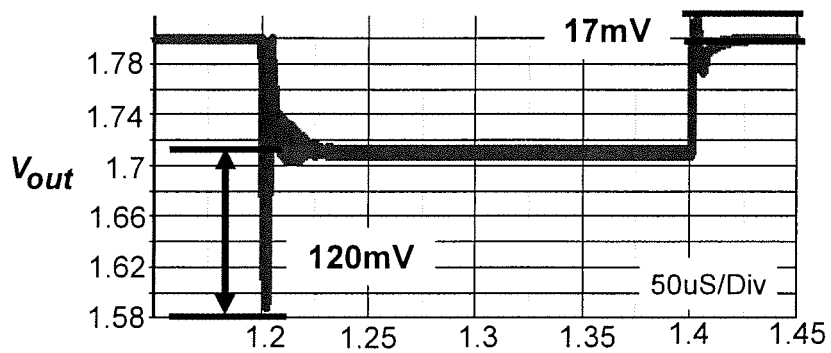
Figure 16B:
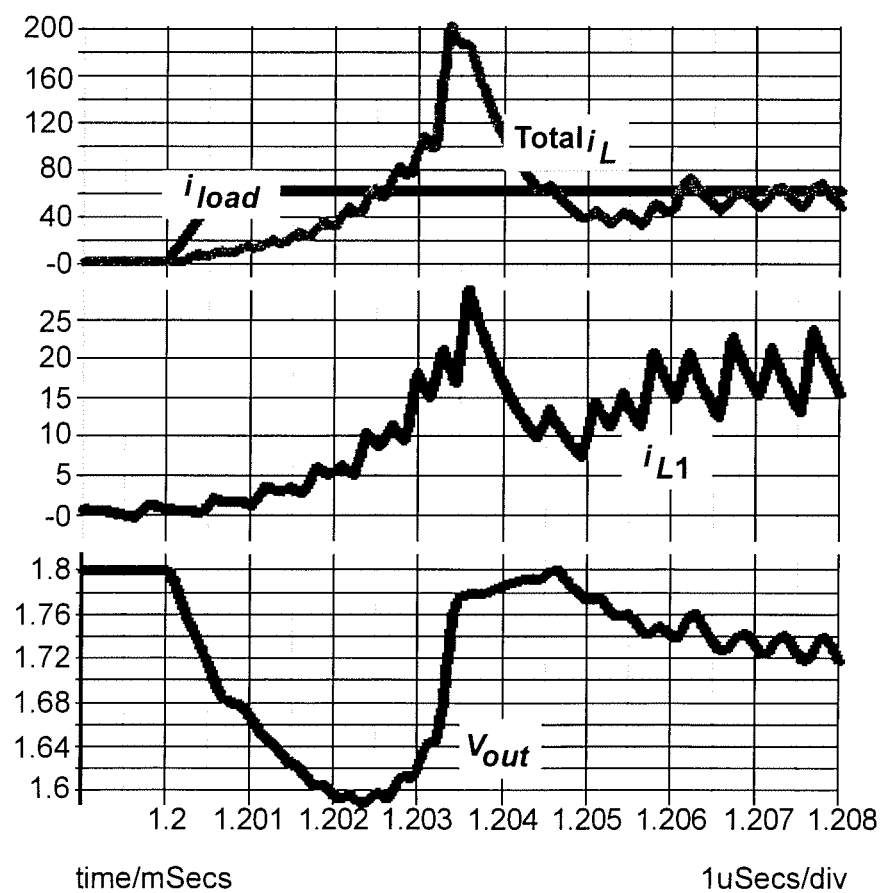
Figure 16C:
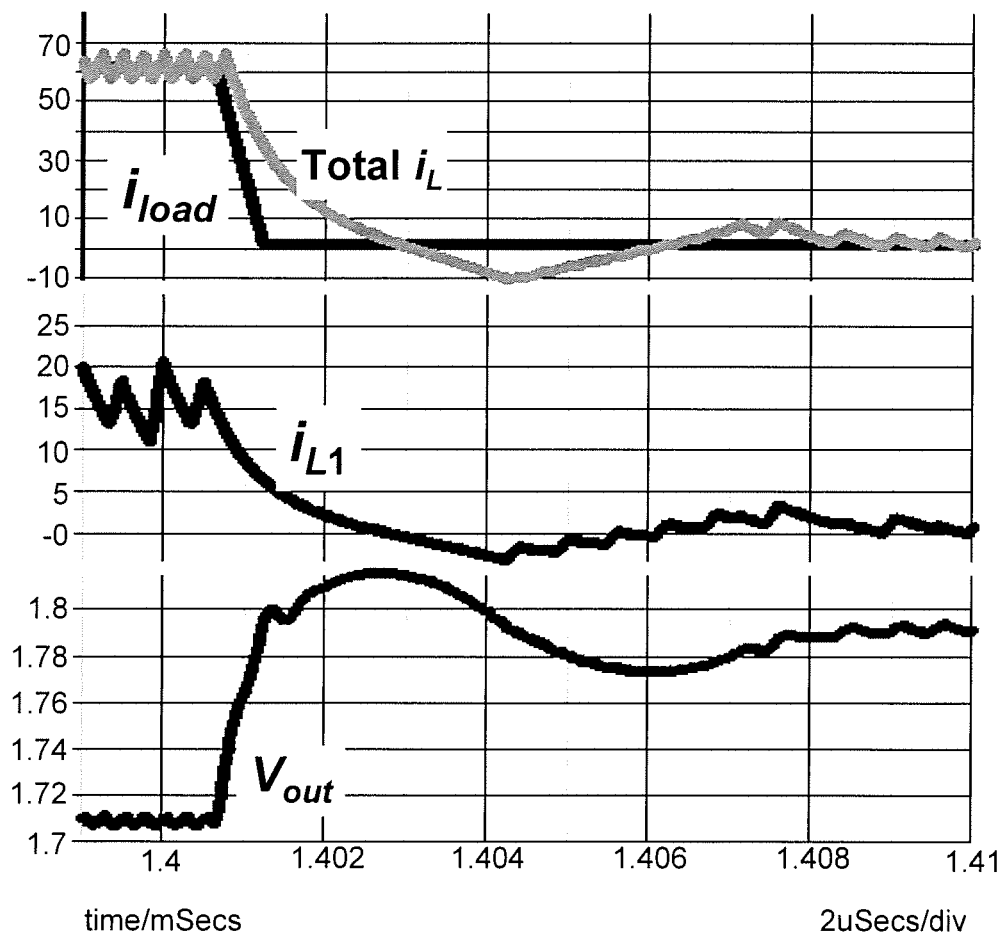

The transient performance of the coupled inductor structure of FIG. 6 and having the above exemplary dimensions has been evaluated by simulation in a voltage regulator (VR) for a laptop computer using a four-phase interleaved buck converter. The four inductors are constituted by two pieces of a two-phase coupled inductor such as that of FIG. 6 and are operated at $V_{in}$=12V, $V_{out}$=1.8V, $i_{out}$=20 A and switching frequency, $f_s$=1 MHz. In this simulation, the hybrid interleaving, constant on-time controller is arranged to have a minimum off-time of 150 nsec. and 50 nsec. propagation delay. The output capacitance value is only 484 μF constituted by 18 22 μF ceramic capacitors inside the socket and 2 22 μF ceramic capacitors outside the socket, 44 μF die and package capacitance in total. The load current is increased or decreased between 1 A and 61 A with a slew rate of 100 A/μsec. The resulting waveforms are shown in FIG. 16A with the step-up and step-down portions shown in enlarged form in FIGS. 16B and 16C, respectively. Large voltage spikes are observed at both the step-up and step-down transients, and the step-up transient of FIG. 16B because the inductor current is not able to follow the required load step-up due to the large light load inductance discussed above in connection with FIG. 4. Such performance presents particularly severe problems for VR applications particularly for powering digital processor chips where the load transient requirements can be especially severe. To reduce the current spikes either more output capacitance should be added or light load transient inductance should be dramatically decreased.

Figure 17:
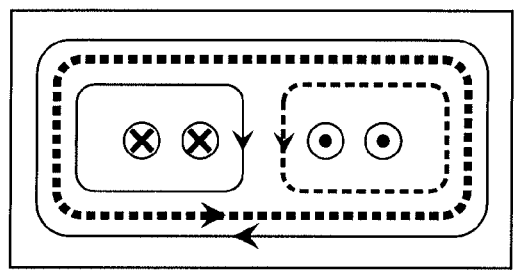
FIG. 17 illustrates flux lines in one-half of the core of a lateral flux coupled inductor of FIG. 6, FIGS. 18A and 18B illustrate flux distributions in the half core of FIG. 17 at full load and light load, respectively.
Figure 18A:
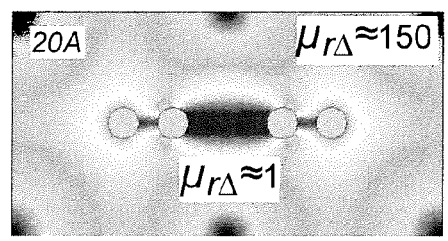
Figure 18B:
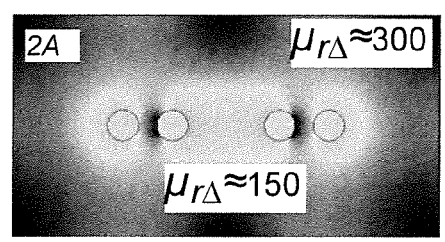

To address the latter approach to this problem (since use of large capacitors is essentially precluded by the applications for which very small power converters are principally intended) and to understand the fundamental reason underlying the problem, the magnetic field distribution in the core must be carefully investigated. Because of symmetry of the coupled inductor of FIG. 6, only one-half of the core is depicted in each of FIGS. 17-20. In the inverse coupled inductor, the coupled DC flux lines illustrated by solid lines of the two windings cancel each other. Therefore, the only remaining DC flux in the core is the leakage DC flux of the two windings as is represented by the dashed lines in FIG. 17. The principal DC flux is seen to exist largely in the leakage flux path in the central core between the two windings and is the summation of the leakage flux of both windings. The much smaller DC flux in the coupled leakage flux path through the core surrounding the four vias is only the leakage flux of one respective winding. FIGS. 18A and 18B illustrate the flux distribution of the half core of FIG. 6 at full load and light load conditions for comparison. It is important to observe that the DC bias flux decreases greatly from full load to light load because there is no air gap in the flux path loop and all of the magnetomotive force drops in the magnetic core to closely surround the vias at light load. Therefore, the permeability of the core is increased at light loads because the DC flux path is of significantly greater effective area which is the principal reason for the non-linear inductance behavior as a function of load discussed above. Additionally, the variation in permeability from full load to light load for the leakage flux path (often a factor of one hundred or more) is much larger than for the coupled flux path (generally a factor of only two to three). The prominent reduction of the reluctance of the leakage flux path from full load to light load creates more leakage flux that, in turn, leads to a reduction in coupling coefficient as the load is decreased. The reluctance of the leakage flux path is very sensitive to the load level.

In accordance with the invention, the light load inductance is decreased by the simple expedient of forming a slot through the middle leg of the core to increase the reluctance thereof and reduce the leakage flux. As will be discussed below, the slots can be formed not only with either of two exemplary forms but any form that can be interpolated or extrapolated therefrom to eliminate or tailor the variation of inductance with load as may be desired or required by a particular application. The preferred form of the slots is generally linear with a central width slightly less than at the ends which are relatively enlarged to have a transverse dimension equal to or slightly greater than the diameter of vias as discussed above and the length of the enlarged ends should accommodate the location of the vias, as well. The length of the relatively narrow central portion and, to a degree, the width of the slot, is dictated by or can be used to control the coupling coefficient between the coupled coils of the coupled inductor.

Once the core material is fabricated as described above, the slot can be formed in any of several ways but laser ablation is preferred for accurate geometry and to provide side and end surfaces that are substantially perpendicular to the core surface. The slot can then be filled with a sacrificial material such as a commercially available material known as FR4 that can be easily removed through an aperture if an air slot is to be formed or with a desired substantially non-magnetic material such as a resin or epoxy that may or may not have other powdered or finely ground particles incorporated therein that is to be left in place in the completed core. Once the slot is filled, holes are drilled (either before or after cladding is applied and patterned) and filled by any know or foreseeable metal deposition method which will be apparent to those skilled in the art. The sacrificial material, if used, may then be removed through the gap between patterned areas of cladding which exposes a portion of the sacrificial material in the slot. Any material that can be applied as a fluid, dried or hardened and later dissolved in a solvent that does not attack either the cladding or the core material would be suitable for use as a sacrificial material.

Figure 19A:
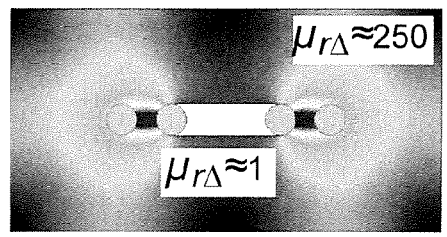
FIGS. 19A and 19B illustrate flux distributions in the half core of FIG. 17 having a middle slot in accordance with the invention at full load and light load, respectively.
Figure 19B:
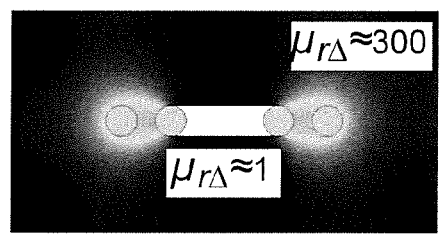
Figure 21:
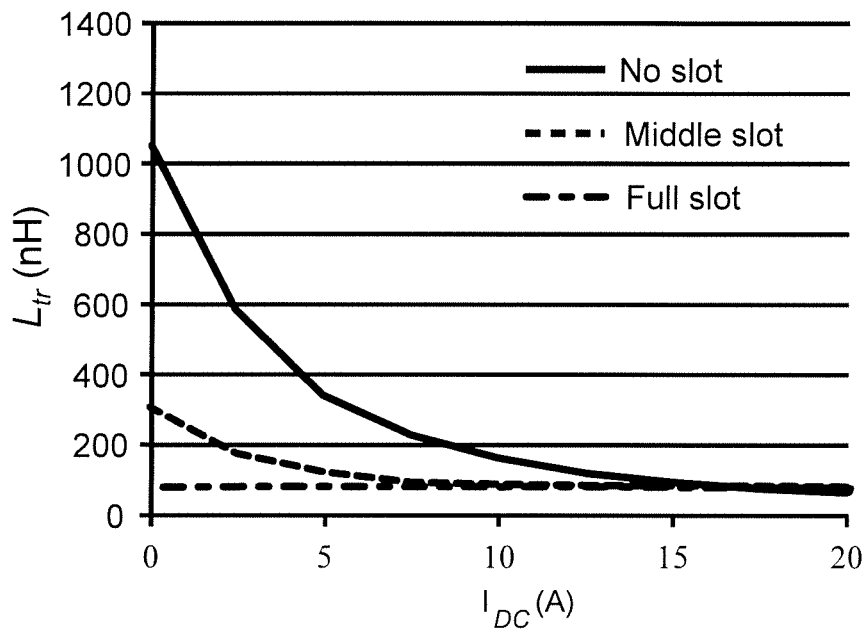
FIGS. 21 and 22 are graphs of transient and steady state inductances for coupled inductors having full, middle or no slots, respectively.
Figure 22:
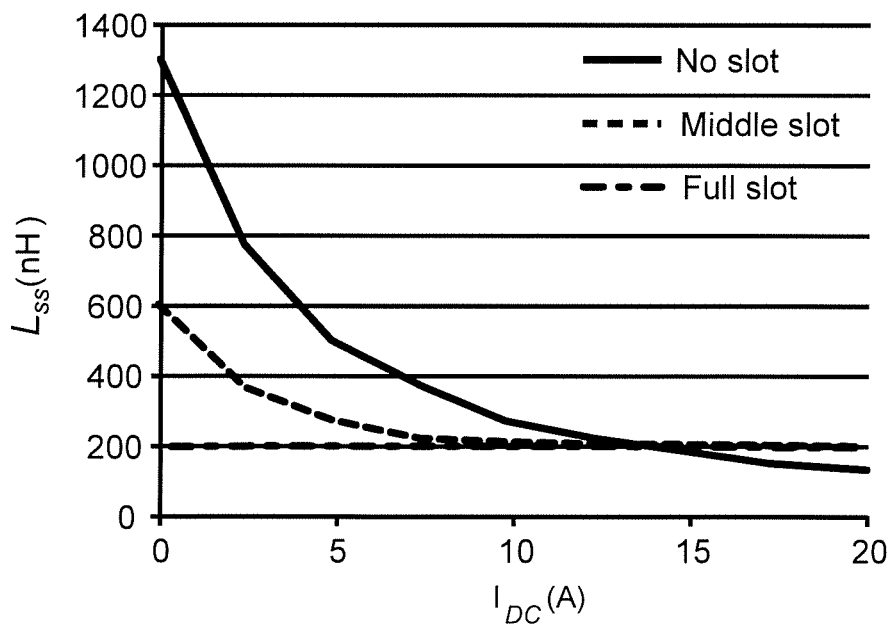
Figure 23:
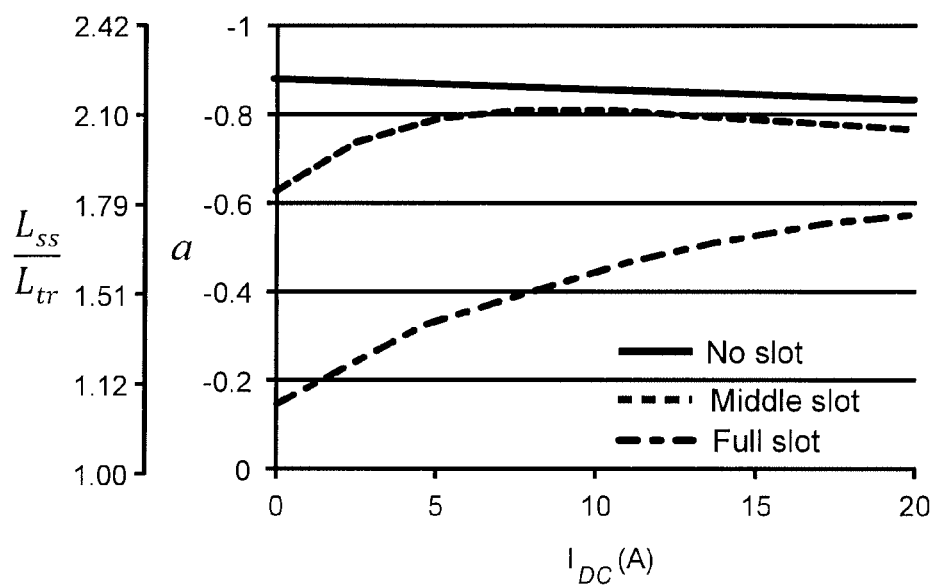
FIG. 23 is a comparison of coupling coefficients for coupled inductors having full, middle or no slots.
Figure 24A:
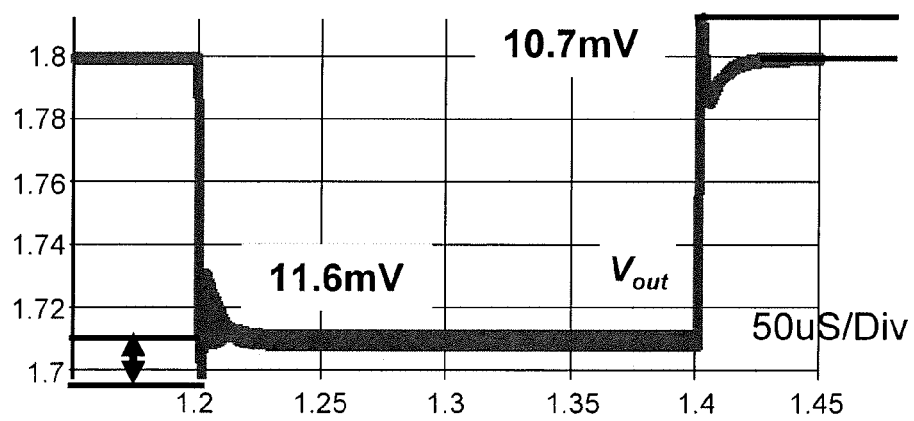
FIGS. 24A, 24B, 24C, 25A, 25B and 25C illustrate step-up and step-down transient voltages for coupled inductors having middle and full slots in accordance with the invention, respectively.
Figure 24B:
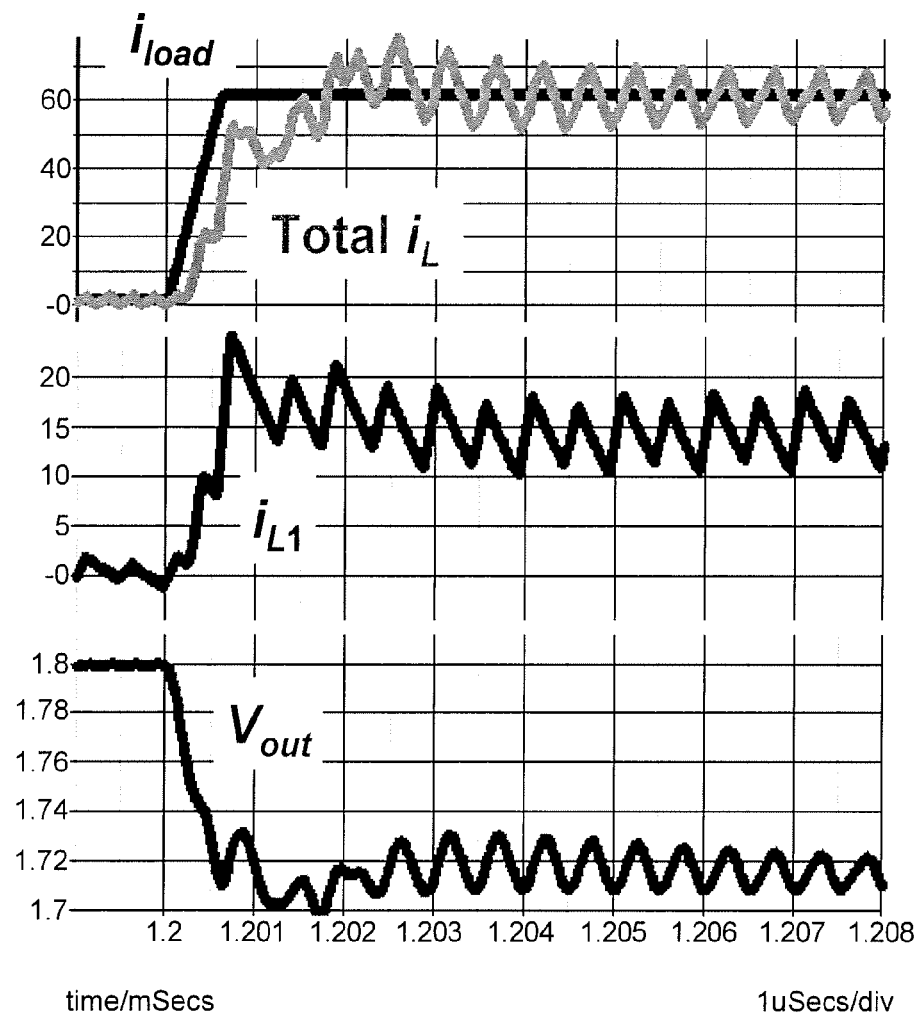
Figure 24C:
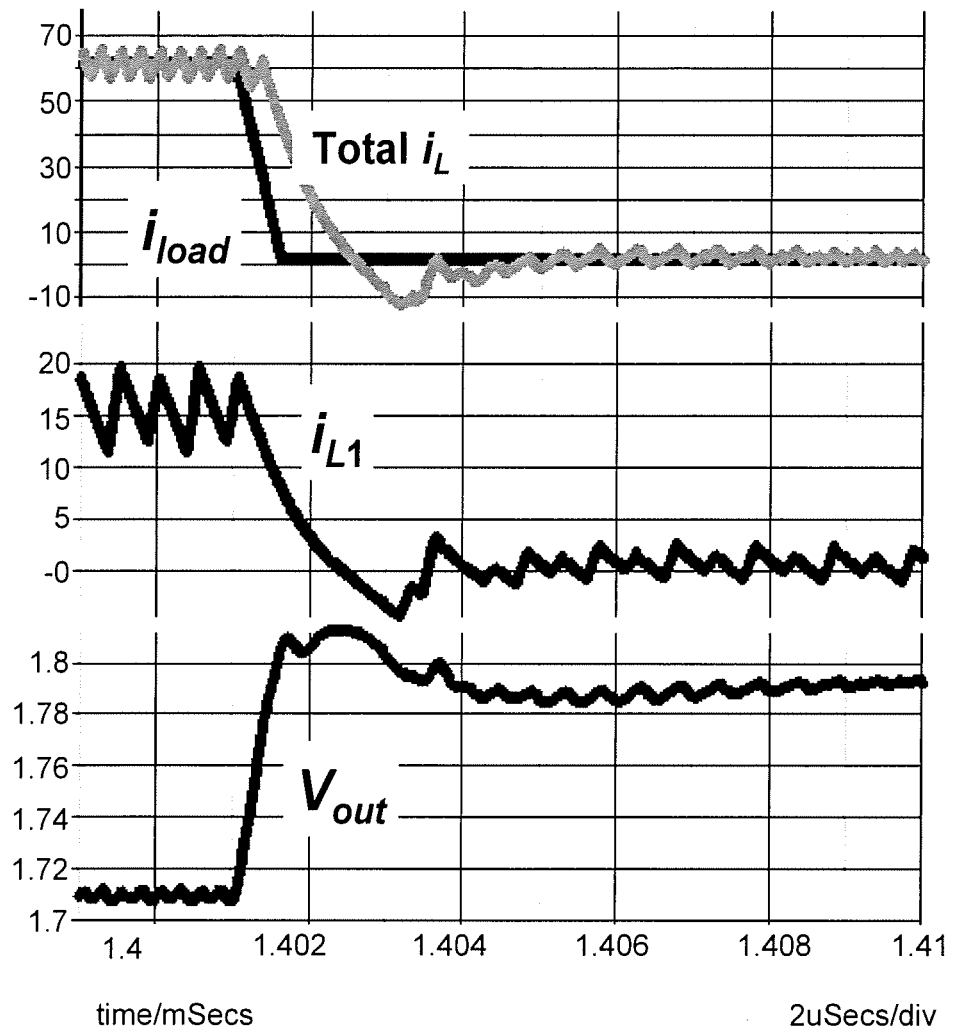
Figure 25A:
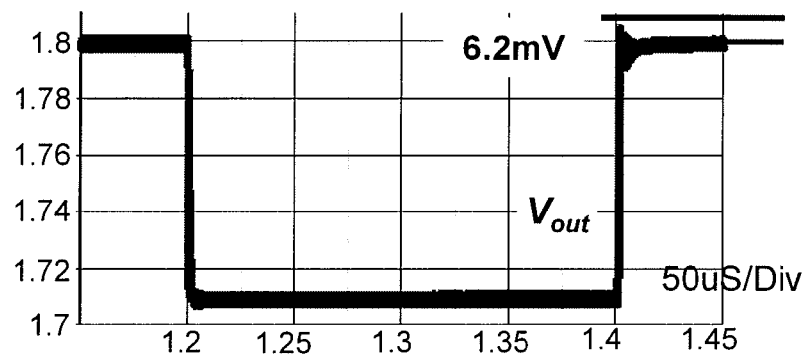
Figure 25B:
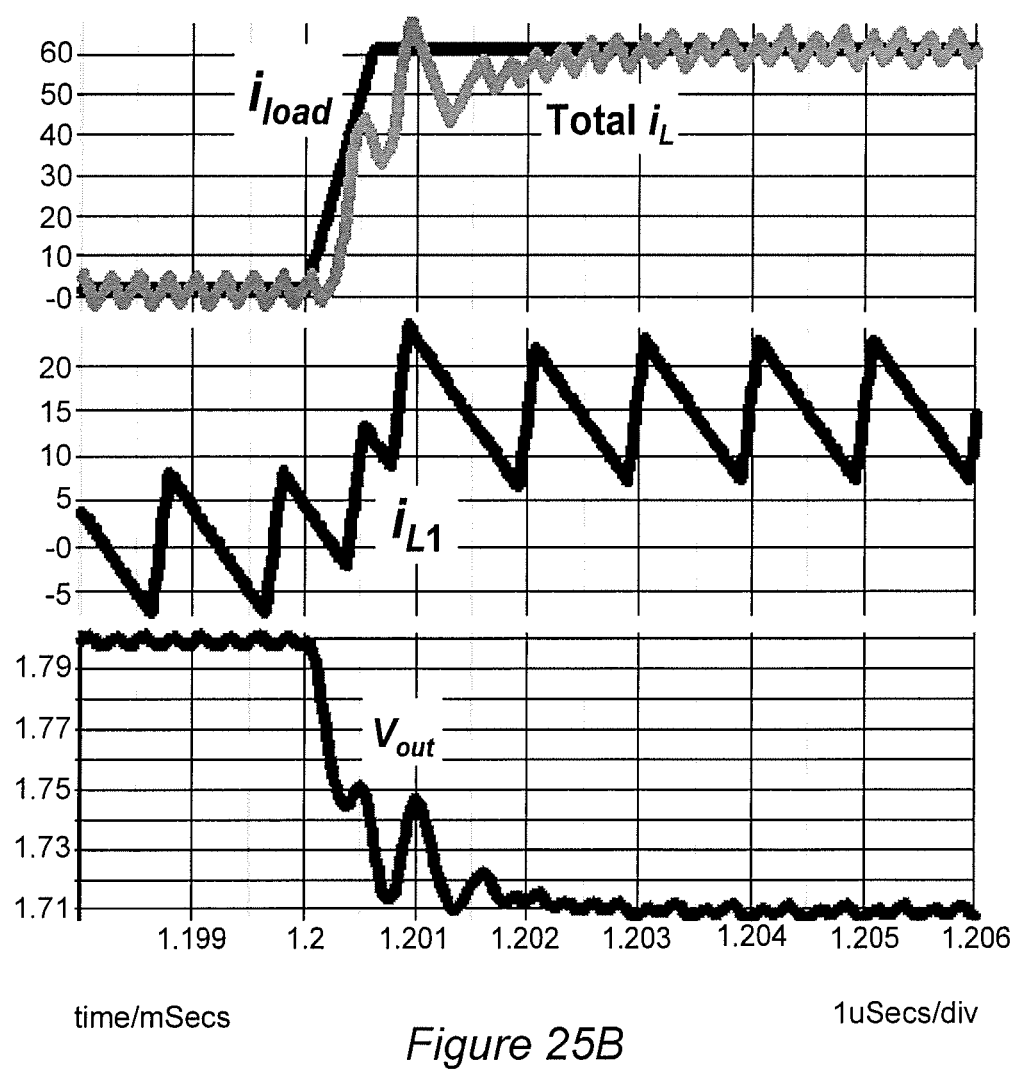
Figure 25C:
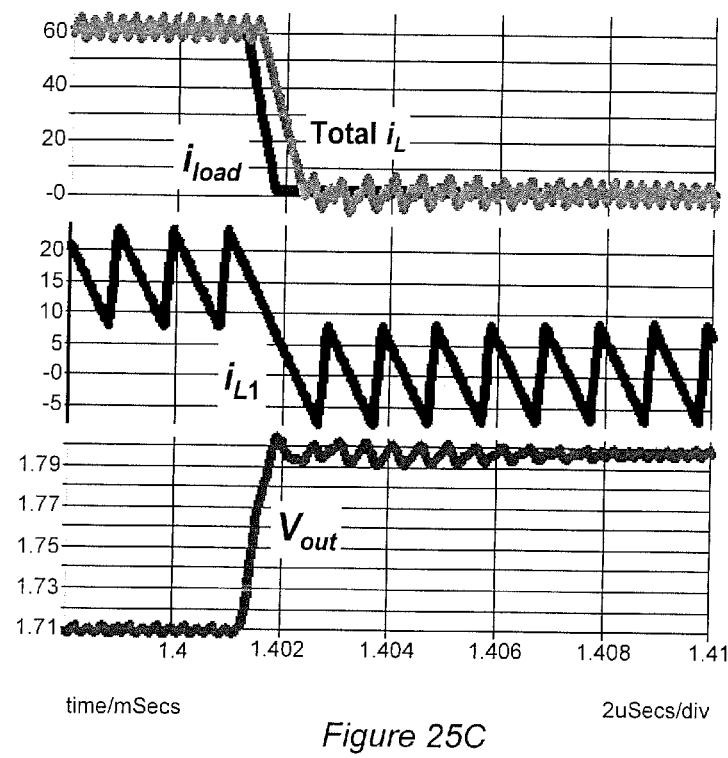

FIGS. 19A and 19B illustrate the flux distribution in a half core with a slot formed through the major portion of the core between the most proximate vias. Such a slot will be referred to hereinafter as a middle slot where only a minimal amount of core material of the central core leg, if any, is allowed to remain between the most proximate vias. The slot is then filled with a non-magnetic material such as resin or epoxy or simply left filled with ambient air as in the example that will be described below. When such a slot, particularly an air slot is located in the central core leg, the MMF across the slot drops to a negligible level and the DC bias of the core becomes very low, regardless of load. On the other hand, the permeability of an air slot is always one, which is independent of the bias current and the reluctance of the leakage path becomes insensitive to the load. From the DC flux distribution for heavy and light loads shown in FIGS. 19B and 19A, respectively, it can be seen that the difference of the core becomes smaller than the difference between load of the inductor core without the slot. Both the permeability and reluctance of both the leakage flux path and the coupled flux path are much more stable than in the absence of the middle slot. The predicted steady state inductance, transient inductance and coupling coefficient of the exemplary embodiment with a middle slot are shown in FIGS. 21, 22 and 23, respectively, and it is clearly seen that the non-linearities and change of inductance with load are much reduced. However, some non-linearities remain due to the remaining core material between the vias of each respective winding. Such small non-linearities may be desirable as alluded to above to reduce current ripple at light loads.

Figure 20A:
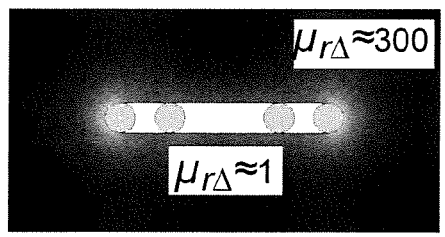
FIGS. 20A and 20B illustrate flux distributions in the half core of FIG. 17 having a full slot in accordance with the invention at full load and light load, respectively.
Figure 20B:
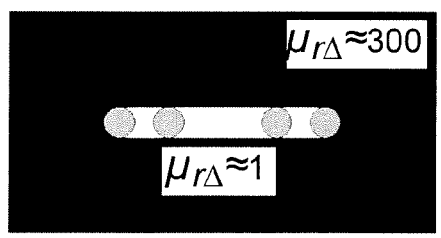

If the core material between the vias of each winding is also removed, the resulting configuration is referred to as a full slot yielding the flux distribution in a half core illustrated in FIGS. 20A and 20B and shows that the flux distribution varies only slightly from full load to light load. Moreover, there is no leakage flux path that can engender sensitivity to load level. The steady state and transient inductances and coupling coefficient for the full slot example are also shown in FIGS. 21, 22 and 23, for comparison with the middle slot and no slot examples.

The transient performance of power converters using coupled inductors with middle and full slots have been examined by simulation under the conditions of the simulation discussed above and the respective transient waveforms are illustrated in FIGS. 24A, 24B, 24C, 25A and 25B, respectively. It should be noted from the output voltage waveform that this exemplary power converter is controlled to provide adaptive voltage positioning (AVP) in which output voltage is reduced slightly as load current is increased. When AVP is specified for a given load device, such as a digital processor, that specification is usually very stringent and critical such that overshoot or undershoot must be held to very close tolerances. Compared with the performance of the power converter using the very non-linear coupled inductor without slots, the middle and full slots provide very moderate non-linear inductance variation with load. It should be noted that the overshoot and undershoot peaks or spikes for the embodiment with a middle slot are much smaller and substantially symmetrical, in contrast with the large undershoot spike observed in FIG. 16. The undershoot using the full slot embodiment is not discernable and the overshoot is held to a very small value only slightly more than one-half that of the middle slot embodiment. Therefore, if the transient response is not particularly stringent, an embodiment having a middle slot can be used while an embodiment having a full slot provides performance suitable for the stringent transient performance requirements of relatively powerful digital processors and similar critical loads.

Figure 26:
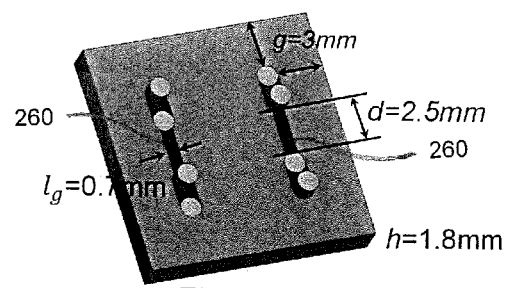
FIG. 26 is an oblique view of an embodiment of a low profile coupled inductor having an air slot.
Figure 27:
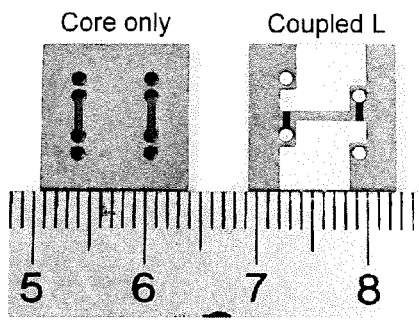
FIGS. 27 and 28 are photographs of prototype coupled inductors having middle and full air slots, respectively.
Figure 28:
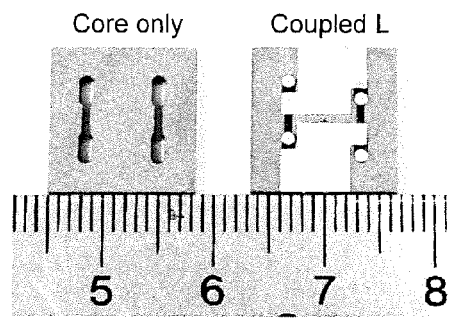

FIG. 26 is an oblique view of a low profile coupled inductor with air slots and without the cladding that, together with via connections, completes the winding structures. Plan view of cores having middle and ful slots with and without cladding are shown in FIGS. 27 and 28. Preferred but exemplary dimensions of g=3 mm, h=1.8 mm, and d=2.5 mm are also illustrated in FIG. 26 and may be projected from the scale also shown in FIGS. 38 and 28. The width of the air slot is $l_g$=0.7 mm which is sufficient for the practice of the invention to achieve its meritorious effects but is the smallest slot width that has been reliably produced at the present time. However, wider or narrower slots can provide an additional degree of freedom in tailoring the inductance as a function of load. For example, a slot width that is effectively narrower than 0.7 mm can be produced by filling the slot with a material that is more permeable than air but less permeable than the core material to tune the inductance as a function of load or otherwise depositing a material in the slot that has a permeability differing from that of the core. The slot can also be varied in width to control flux leakage change with DC bias with substantially complete flexibility. The equivalent of variation in slot width can also be varied to an effective width of less than 0.7 mm by filling the slot with particular materials that are largely non-magnetic but may have some slight magnetic properties such as a small amount of ferrite powder incorporated into a resin or epoxy. Therefore, the steady state and transient inductance and coupling factor, a, can be fully controlled, as desired, to be substantially optimal for the requirements of any application.

Figure 29:
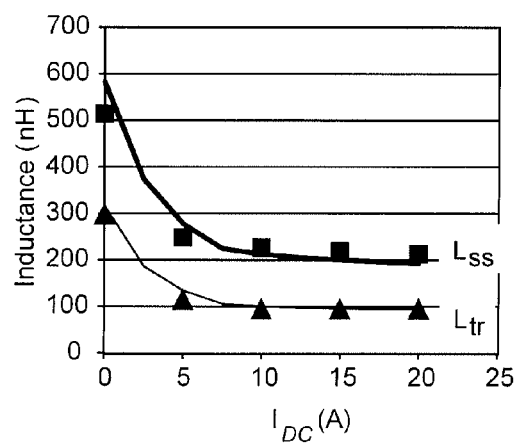
FIGS. 29 and 30 are graphs of measured steady state and transient inductance of the coupled inductor with middle slots and full slots, respectively, in accordance with the invention.
Figure 30:
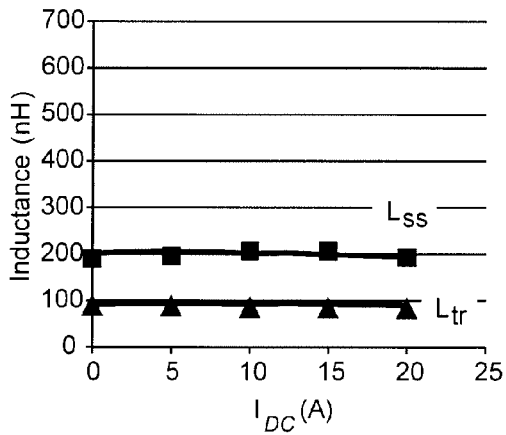

The measured steady state and transient inductances of coupled inductors having middle and full slots are shown in FIGS. 29 and 30, respectively. In FIG. 29, the non-linearity remains evident but the divergence of steady state and transient inductance values is much reduced from that discussed above in connection with FIGS. 4 and 5. In FIG. 30, the steady state and transient inductance values are not observed to diverge at all and the steady state and transient inductance values are slightly smaller and substantially invariant for the entire and wide load range with a substantially constant ratio of steady state and transient inductance values.

In view of the foregoing, it is seen that the invention provides a simple structural modification of a low-profile coupled inductor that can be easily and reliably performed that provides substantially and unexpectedly improved transient performance as well as numerous degrees of design freedom (e.g., slot width, slot length, adjustment of permeability and reluctance and control of leakage flux and coupling coefficient) to eliminate or tailor inductance change with load to a given application and transient response specifications. The power density of power converters to which the invention may be applied is not diminished by the inclusion of a slot of a given design in a low-profile coupled inductor which is thus made highly appropriate for small electronic devices such as smart phone, palm-top and tablet computers and the like.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A coupled inductor having a conductor forming two inversely coupled windings comprising vias in a lamina of magnetic material and cladding on said lamina of magnetic material or material surrounding said lamina of magnetic material, said lamina of magnetic material including a slot extending in a direction between two vias of respective ones of said two inversely coupled windings, said slot having a width, length and permeability to control leakage inductance between said inversely coupled windings in said lamina of magnetic material such that variation of inductance of said coupled inductor with load is eliminated or tailored.

2. The coupled inductor as recited in claim 1, wherein said slot has a width equal to or greater than 0.7 mm.

3. The coupled inductor as recited in claim 1, further including a material in said slot having a permeability greater than permeability of air and lesser permeability than material of said lamina of magnetic material.

4. The coupled inductor as recited in claim 1, Wherein said magnetic material comprises flakes of magnetic material embedded in an organic binder.

5. The coupled inductor as recited in claim 4, wherein said magnetic material is a magnetic alloy.

6. The coupled inductor as recited in claim 1, wherein said core forms a portion of a substrate of an electronic device.

7. The coupled inductor as recited in claim 6, wherein said substrate is a printed circuit board.

8. The coupled inductor as recited in claim 7, wherein said core is embedded or laminated within said printed circuit board.

9. The coupled inductor as recited in claim 1, wherein said slot extends less than the full distance between said two vias.

10. The coupled inductor as recited in claim 1, wherein said slot removes all core material between all said vias.

11. The inductor as recited in claim 10, wherein said core forms a portion of a substrate of an electronic device.

12. The inductor as recited in claim 11, wherein said substrate is a printed circuit board.

13. The inductor as recited in claim 12, wherein said core is embedded or laminated within said printed circuit board.

* * * * *